(12) United States Patent
Veliadis

(10) Patent No.: US 8,664,048 B2
(45) Date of Patent: Mar. 4, 2014

(54) SEMICONDUCTOR DEVICES WITH MINIMIZED CURRENT FLOW DIFFERENCES AND METHODS OF SAME

(75) Inventor: John V. Veliadis, Hanover, MD (US)

(73) Assignee: Northrop Grummen Systems Corporation, Los Angeles, CA (US)

( * ) Notice: Subject to any disclaimer, the term of this patent is extended or adjusted under 35 U.S.C. 154(b) by 240 days.

(21) Appl. No.: 12/980,005

(22) Filed: Dec. 28, 2010

(65) Prior Publication Data

US 2012/0161208 A1 Jun. 28, 2012

(51) Int. Cl.
*H01L 21/332* (2006.01)
*H01L 21/8238* (2006.01)

(52) U.S. Cl.
USPC ............ 438/134; 438/136; 438/212; 438/268

(58) Field of Classification Search
USPC .................................. 438/134–138, 212, 268
See application file for complete search history.

(56) References Cited

U.S. PATENT DOCUMENTS 6,995,052 B1* 2/2006 Yu et al. ...................... 438/189

* cited by examiner

*Primary Examiner* — Cuong Q Nguyen
(74) *Attorney, Agent, or Firm* — Andrews Kurth LLP; Sean S. Wooden; Matthew J. Esserman

(57) ABSTRACT

A semiconductor device with minimized current flow differences and method of fabricating same are disclosed. The method includes forming a semiconductor stack including a plurality of layers that include a first layer having a first conductivity type and a second layer having a first conductivity type, in which the second layer is on top of the first layer, forming a plurality of mesas in the semiconductor layer stack, and forming a plurality of gates in the semiconductor layer stack having a second conductivity type and situated partially at a periphery of the mesas, in which the plurality of gates are formed to minimize current flow differences between a current flowing from the first layer to the plurality of mesas at a first applied gate bias and a current flowing from the first layer to the plurality of mesas at a second applied gate bias when voltage is applied to the semiconductor device.

15 Claims, 17 Drawing Sheets

SEMICONDUCTOR DEVICES WITH MINIMIZED CURRENT FLOW DIFFERENCES AND METHODS OF SAME

FIELD

The invention relates generally to semiconductors, and more particularly, to methods of fabricating semiconductor devices with minimized current flow differences and semiconductor devices with minimized current flow differences.

BACKGROUND

There are a large number of solid-state circuit breaker and renewable energy applications that require semiconductor device configurations capable of bi-directional power flow. Some examples if such applications include:

1. Solid-State Circuit Breakers

Provide bidirectional fault isolation in a fraction of a microsecond, in power electronic circuits such as those used in industrial applications and hybrid vehicles. The mechanical contactors used presently are too slow and suffer severe degradation during repeated fault isolation.

This technology is actively sought by the Army for their hybrid military ground vehicles, by the Air-Force for their latest generation fighter-aircraft 270 DC power system, and by the navy for their high-voltage ship systems. Solid-state (semiconductor) circuit breakers will eventually be present in every hybrid vehicle and every industrial power circuit that needs fault protection.

2. Bidirectional Power Flow Enables Regeneration Applications

Industrial applications can reap significant energy savings by returning otherwise wasted energy to the AC mains. Examples include rolling mills, conveyor belts, and elevators. In electric-gasoline hybrid vehicles, bidirectional power flow is needed for the battery to provide a cold start and to receive and store the regenerated energy from braking.

3. Photovoltaic Bidirectional Power Transfer to the Utility Grid and Batteries

Bidirectional flow of solar photovoltaic power to the utility AC grid and from the utility AC grid to charge the photovoltaic battery bank.

4. Wind Power Transfer to the Utility Grid and Back

Bidirectional power flow between the wind turbine generator and the utility grid.

5. Fuel Cell Bidirectional Power Flow

In fuel cell hybrid vehicles the electric drive-train motor is supplied by an inverter connected to a fuel cell. In addition, traditional chemical-power batteries are employed to provide better cold start characteristics and the option to recover braking energy. Bidirectional power flow is needed to interface the chemical-power battery with the fuel cells.

Bidirectional Power Flow Requires:

1. Symmetric Current Flow in Forward and Reverse Directions

2. Blocking of a Specified Voltage in Forward and Reverse Directions

Currently, bidirectional, semiconductor power flow applications make use of silicon devices. These include MOSFETs, IGBTs, BJTs, and JFETs. Reliable operation of silicon devices is temperature limited to below 120° C. With respect to wide-bandgap semiconductors devices, silicon devices have a larger physical size (footprint), operate at lower frequencies, and are more resistive. Accordingly, silicon devices experience higher switching and conduction losses, which result in lower system efficiency. An additional drawback of silicon devices is their lower short-circuit hold-off time, i.e., they experience catastrophic failure much faster than wide bandgap devices.

Devices made out of SiC, GaN and other wide-bandgap semiconductors can operate reliably at +300° C., have lower conduction and switching losses, have a smaller physical size, and a longer short-circuit hold-off time. In addition, due to their lower switching losses, wide-bandgap semiconductor devices operate at high frequencies unattainable by silicon which greatly simplifies circuit design and eliminates a number of filters/elements.

Several SiC power devices are candidates for bidirectional power conditioning applications:

SiC BJTs: suffer from forward voltage degradation (reliability issue), and expensive specialized epitaxy wafers must be used to alleviate this problem. BJTs have a relatively low current-gain that complicates gate-drive design and increases gate-drive size and losses. Also, the BJT current-gain deteriorates with temperature and that limits operation to below 200° C. BJTs have a negative temperature coefficient. This raises thermal run-off concerns when paralleling multiple devices to meet the high-current requirements of modern power conditioning systems.

SiC MOSFETs: suffer from low mobility and reliability stemming from its native gate oxide. MOSFETs temperature operational range is limited to ~200° C. due to gate oxide instability and threshold-voltage-shift with temperature. MOSFETs are also complicated devices to fabricate in SiC resulting in increased manufacturing costs.

Lateral-channel vertical JFETs: Have higher resistance than that of vertical-channel JFETs (VJFETs), which increases losses and limits bandwidth. Fabrication is more complicated than that of a VJFET.

Vertical-channel JFETs (VJFETs): no gate-oxide or forward-voltage-degradation reliability concerns, have been operated above 300° C., are voltage-controlled devices when operated in unipolar mode, and are relatively easy to fabricate. At this time, the VJFET is the most mature SiC power transistor.

Given the compelling high-frequency switching, high temperature operation, low-resistance, fabrication-simplicity, long short-circuit hold-off time, and reliability advantages of SiC VJFETs, design techniques for optimal VJFET operation in bidirectional power flow circuits are needed.

For doping levels relevant to power conditioning applications, the wide band-gap of SiC power devices leads to gate-to-source and gate-to-drain pn junction built-in potentials (turn-on) of about 2.7 V, as shown in FIG. 1. FIG. 1 shows VJFET forward gate-to-source (filled triangles) and gate-to-drain (open circles) pn junction characteristics. An important requirement for efficient power-VJFET gate-drive operation is maintaining voltage-control capability by having the gate-to-source and gate-to-drain pn junctions operate below their built-in potential values, i.e., unipolar VJFET operation. This biasing condition also contributes to VJFET reliability.

It was shown in U.S. application Ser. No. 12/623,655, entitled SYSTEM AND METHOD FOR PROVIDING SYMMETRIC EFFICIENT BI-DIRECTIONAL POWER FLOW AND POWER CONDITIONING, which is hereby incorporated by reference, that two VJFETs connected in common source configuration can achieve efficient (unipolar, VJFET pn junctions do not turn on) symmetric bidirectional power flow operation, under the gate bias conditions below (where $V_{GS}$ is the common gate-to-source bias voltage, $V_{D2S}$ is the drain-to-source bias voltage for the second VJFET and $V_{D1S}$ is the drain-to-source bias voltage for the first VJFET):

$$V_{GS} \leq 2.5V - |V_{D2S}| \text{ and } V_{GS} \leq 2.5V - |V_{D1S}| \qquad (1)$$

Typical on-state drain current characteristics vs. drain voltage of a high-voltage normally-on VJFET, at a gate-to-source bias range of 0 to 3 V in steps of 0.5 V, are shown in FIG. 2. Typical on-state drain current characteristics vs. drain voltage for the high-voltage VJFET of FIG. 2, at a gate-to-source bias range of 0 to −4.5 V in steps of 0.5 V, are shown in FIG. 3. At a gate-to-source bias of −4.5 V, the VJFET's channel is pinched-off and negligible current flows through the VJFET's drain. It is evident from FIGS. 2 and 3, that operating the VJFET at a unipolar gate bias of $V_{GS}=2.5$ V allows for maximum drain current output without the deleterious effects of turning on the gate-to-source pn junction. In addition, FIGS. 2 and 3 show that reducing the $V_{GS}$ gate bias leads to an undesirable reduction in current output. From Eq. (1) above, it is clear that VJFETs connected in common source configuration for efficient (unipolar) symmetric bidirectional power flow will always operate below the gate bias of $V_{GS}=2.5$ V that maximizes their current output. Also, in applications like solid-state circuit breakers where the VJFETs are in the on-state for the vast majority of time, it is desirable that the on-state corresponds to a passive $V_{GS}=0$ V so that conduction is maintained with no active bias applied to the gate.

Modern power conditioning applications require high levels of current and numerous devices need to be paralleled. From the above, it is seen that VJFET design techniques that maximize drain current as the VJFET gate bias $V_{GS}$ drops below its maximum unipolar value of about 2.7 V are needed. Design techniques than enable VJFETs to achieve optimal operation in bi-directional circuits per the above are needed.

SUMMARY

Embodiments described herein overcome the disadvantages of the prior art. These and other advantages are achieved by, for example, a semiconductor device with minimized current flow differences. The semiconductor includes a semiconductor stack including a plurality of layers that include a first layer having a first conductivity type and a second layer having a first conductivity type, the second layer is on top of the first layer, a plurality of mesas formed in the semiconductor layer stack, and a plurality of gates formed in the semiconductor layer stack having a second conductivity type and situated partially at a periphery of the mesas, in which the plurality of gates are formed to minimize current flow differences between a current flowing from the first layer to the plurality of mesas at a first applied gate bias and a current flowing from the first layer to the plurality of mesas at a second applied gate bias when voltage is applied to the semiconductor device.

These and other advantages are also achieved by a method for fabricating a semiconductor device with minimized current flow differences. The method includes forming a semiconductor stack including a plurality of layers that include a first layer having a first conductivity type and a second layer having a first conductivity type, in which the second layer is on top of the first layer, forming a plurality of mesas in the semiconductor layer stack, and forming a plurality of gates in the semiconductor layer stack having a second conductivity type and situated partially at a periphery of the mesas, in which the plurality of gates are formed to minimize current flow differences between a current flowing from the first layer to the plurality of mesas at a first applied gate bias and a current flowing from the first layer to the plurality of mesas at a second applied gate bias when voltage is applied to the semiconductor device.

DETAILED DESCRIPTION DRAWINGS

The detailed description will refer to the following drawings, wherein like numerals refer to like elements, and wherein.

DETAILED DESCRIPTION

Figure 1:
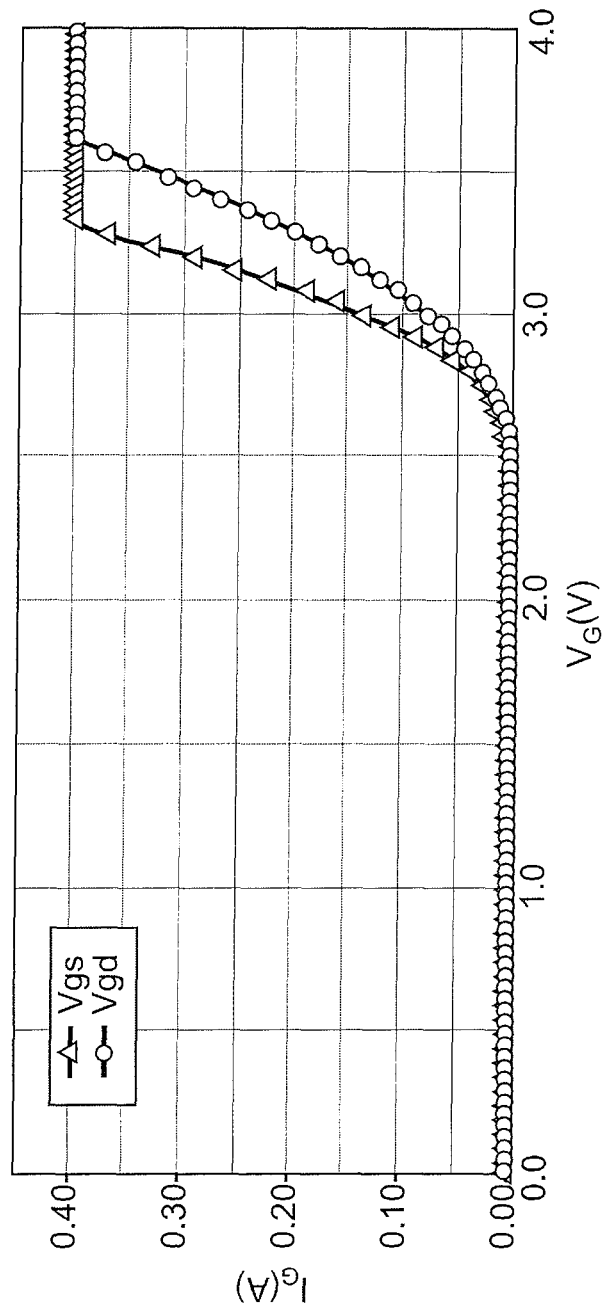
FIG. 1 is a graph illustrating VJFET gate-to-source and gate-to-drain current-flow characteristics for increasing gate voltages.

The description below is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "front," "back," "up," "down," "top" and "bottom," as well as derivatives thereof, should be construed to refer to the orientation as then described or as shown in the drawing figure under discussion. These relative terms are for convenience of description and normally are not intended to require a particular orientation. Terms concerning attachments, coupling and the like, such as "connected" and "attached," refer to a relationship wherein structures are secured or attached to one another either directly or indirectly through intervening structures, as well as both movable or rigid attachments or relationships, unless expressly described otherwise.

In describing various embodiments, specific terminology is employed for the sake of clarity. However, the invention is not intended to be limited to the specific terminology so selected. It is to be understood that each specific element includes all technical equivalents which operate in a similar manner to accomplish a similar purpose.

The foregoing disclosure and description of the invention are illustrative and explanatory thereof, and various changes in the size, shape and materials, as well as in the details of the illustrated construction may be made without departing from the spirit of the invention. Although certain embodiments of the semiconductor device with minimized current flow differences discussed below utilize a SiC VJFET with gates, source pillars, and a drain for illustration purposes, a person of ordinary skill in the art will readily recognize that the semiconductor device with minimized current flow differences is not limited to the design and/or fabrication of this particular device, and may, in fact, be used in the design and/or fabrication of any semiconductor device including MOSFET, MESFET, IGBT, BJT, Thyristor, Diode, and JFET utilizing a variety of wide bandgap materials including SiC, GaAs, GaN, $Al_xGa_{1-x}N$/GaN, $In_xGa_{1-x}N$/GaN, Si, sapphire, and diamond, wherein $0<x<1$. Described herein are embodiments of semiconductor devices with minimized current flow differences and methods of fabricating semiconductor devices with minimized current flow differences that overcome the disadvantages of the prior art described above. Embodiments implement VJFET design techniques that maximize drain current as the VJFET gate bias $V_{GS}$ drops below its maximum unipolar value.

Figure 4:
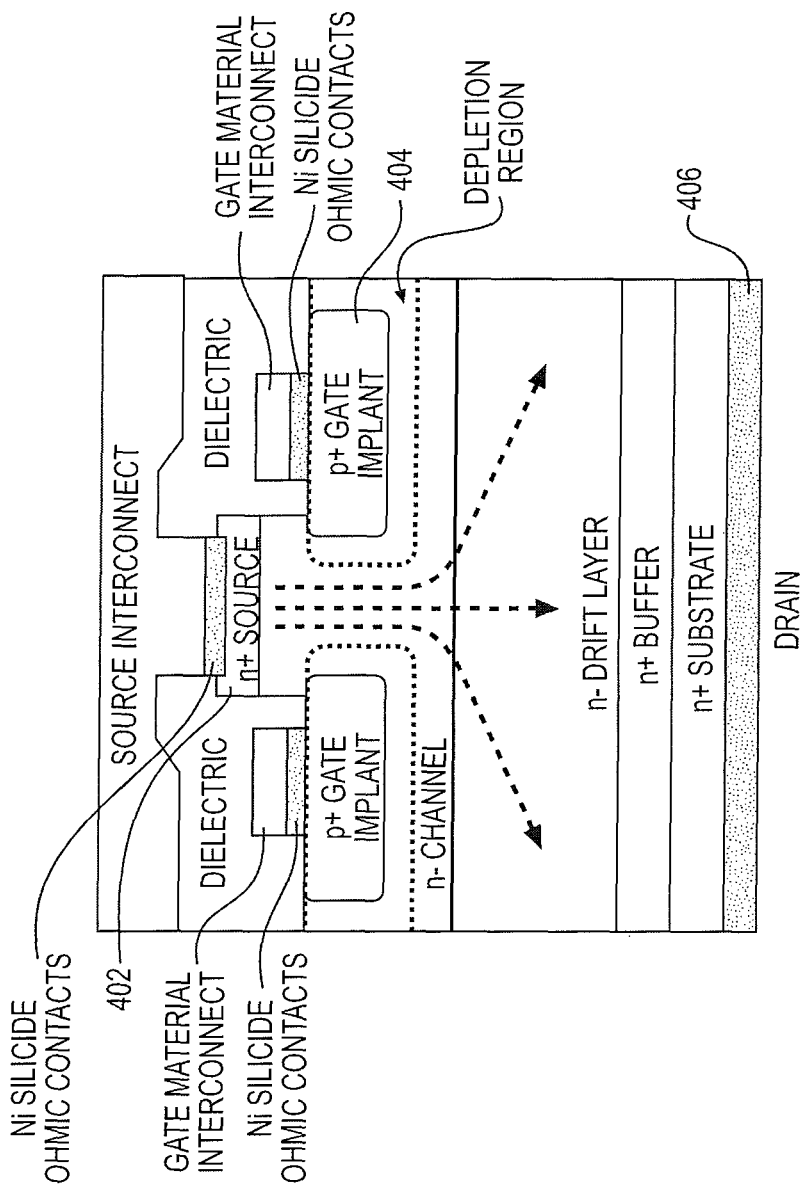
FIG. 4 is a schematic diagram of a VJFET illustrating electron flow during operation.

FIG. 4 provides a schematic of a portion of a typical VJFET 400. As shown, VJFET 400 includes a source pillar 402 (n+ source on n+ source/n− channel mesa), gates 404 (p+ gate implants in n− channel layer) and drain 406 (beneath n− drift layer, n+ buffer, and n+ substrate). Gates 404 and source pillars 402 may include Nickel Silicide ohmic contacts and be connected with other gates 404 and source pillars 402 by gate metal and source interconnect metal, respectively. Drain 406 may also include Nickel Silicide ohmic contact. In the on-state, majority carriers (electrons) flow vertically from source to drain. To control the drain current through the device the gates are subjected to a voltage, which adjusts the width of the depletion regions between the p-type gates in the n-type channel. It is disclosed herein that by increasing the spacing between the VJFET's p+ gates, on-state resistance is reduced and the VJFET's drain current experiences minimal reduction as the applied gate bias drops below the maximum unipolar level of about $V_{GS}=2.7$ V. In SiC VJFETs, the positive unipolar gate biases are between 0 and 2.7V. Embodiments also disclose techniques for designing a large gate-to-gate spacing in VJFETs.

Figure 5:
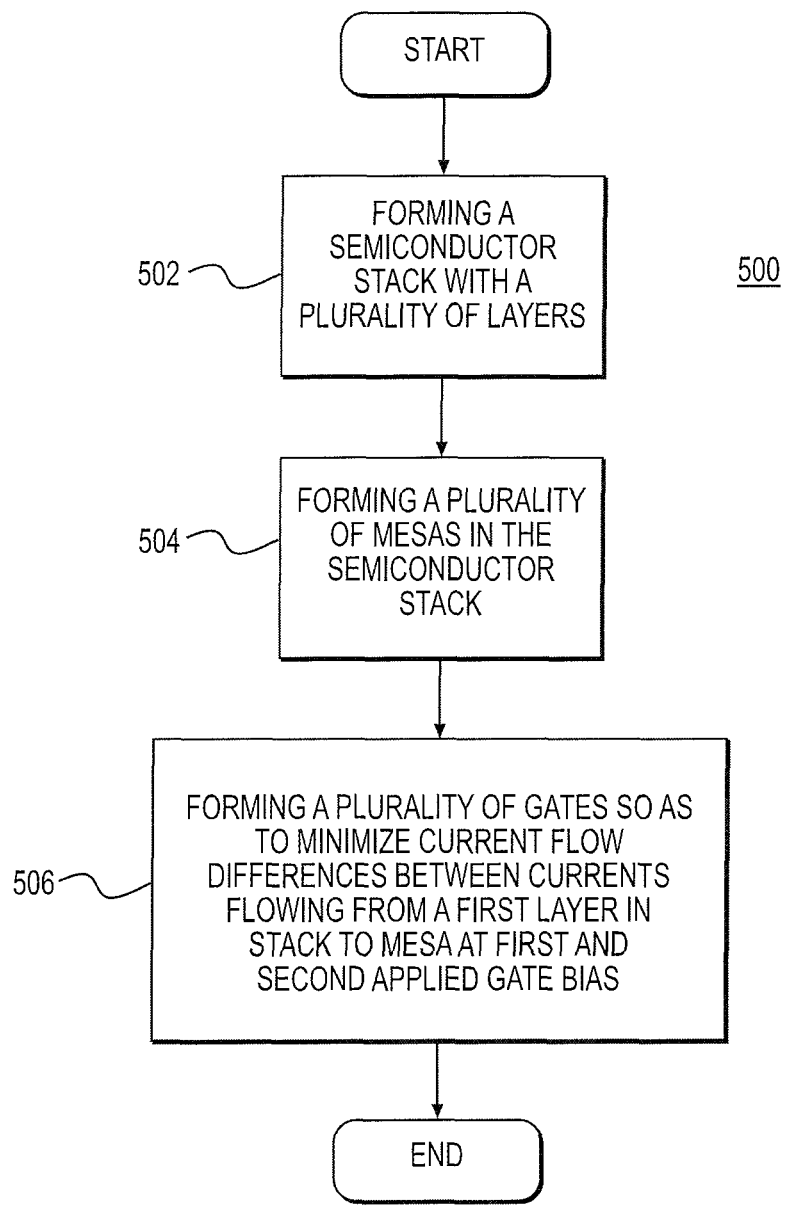
FIG. 5 is a flowchart illustrating an embodiment of a method for fabricating a semiconductor device with minimized current flow differences.

With reference now to FIG. 5, shown is an embodiment of a method 500 of fabricating semiconductor devices with minimized current flow differences. Method 500 forms a semiconductor stack with a plurality of layers in the semiconductor stack, block 502. The semiconductor stack may be formed 502 using known techniques. For example, materials foaming the layers may be deposited on top of one another to form the stack and then portions of layers may be etched or otherwise removed to form various structures. In embodiments, the semiconductor stack is a VJFET stack formed 502 using SiC. In embodiments the plurality of layers may be formed from SiC, GaAs, GaN, $Al_xGaN_{1-x}$/GaN, $In_xGa_{1-x}N$/GaN, Si, sapphire, or diamond, wherein $0<x<1$.

Figure 6A:
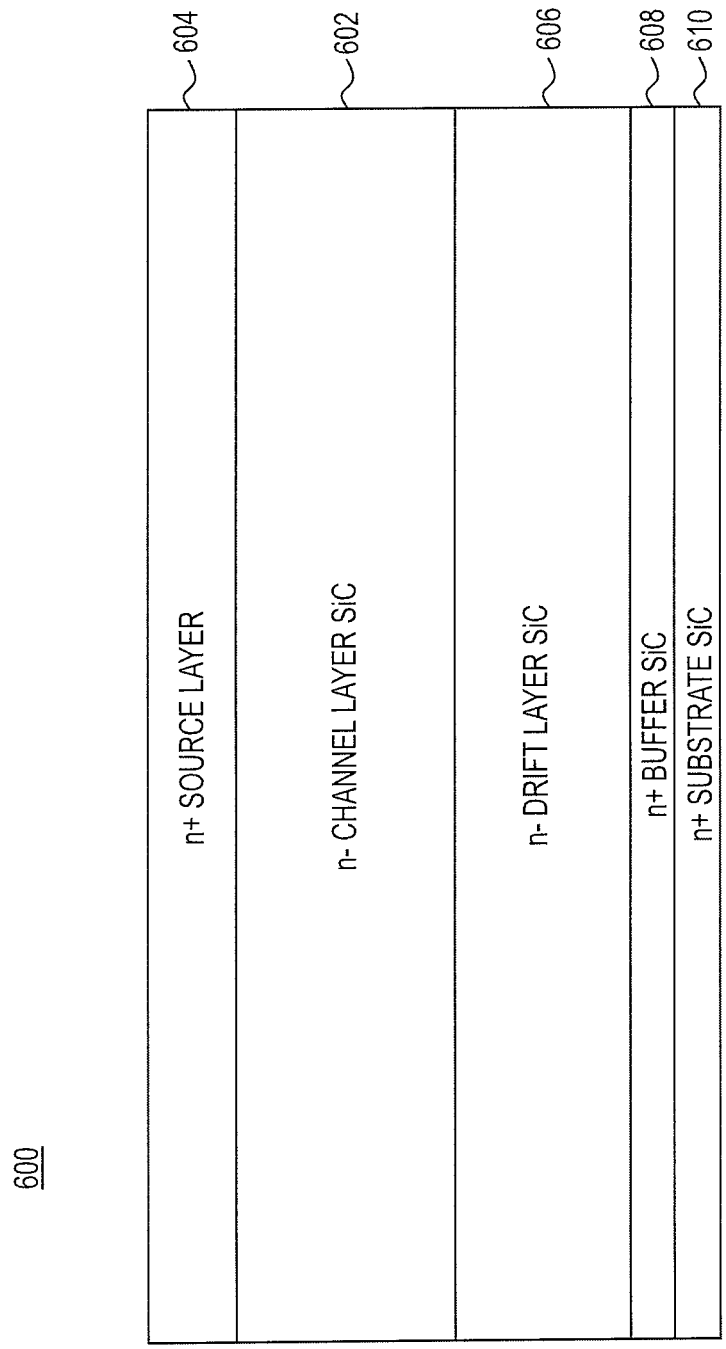
FIG. 6A is a schematic of an exemplary semiconductor stack used to fabricate a semiconductor device with minimized current flow differences.

With reference now to FIG. 6A, shown is an exemplary semiconductor stack 600. The plurality of layers include a first layer 602 of a first conductivity type (e.g., SiC n-channel layer in FIG. 4 VJFET 400) and a second layer 604 having a first conductivity type (e.g., n+ source 504) on top of first layer. The first layer 602 first conductivity type doping level may be from $10^{14}$ $cm^{-3}$ to $10^{18}$ $cm^{-3}$. The second layer 604 first conductivity type doping level may be from $10^{16}$ $cm^{-3}$ to $10^{21}$ $cm^{-3}$. Semiconductor stack may be formed 502 to include additional layers, including drift layer 606, buffer 608 and substrate 610, as shown in FIG. 6A.

Figure 6B:
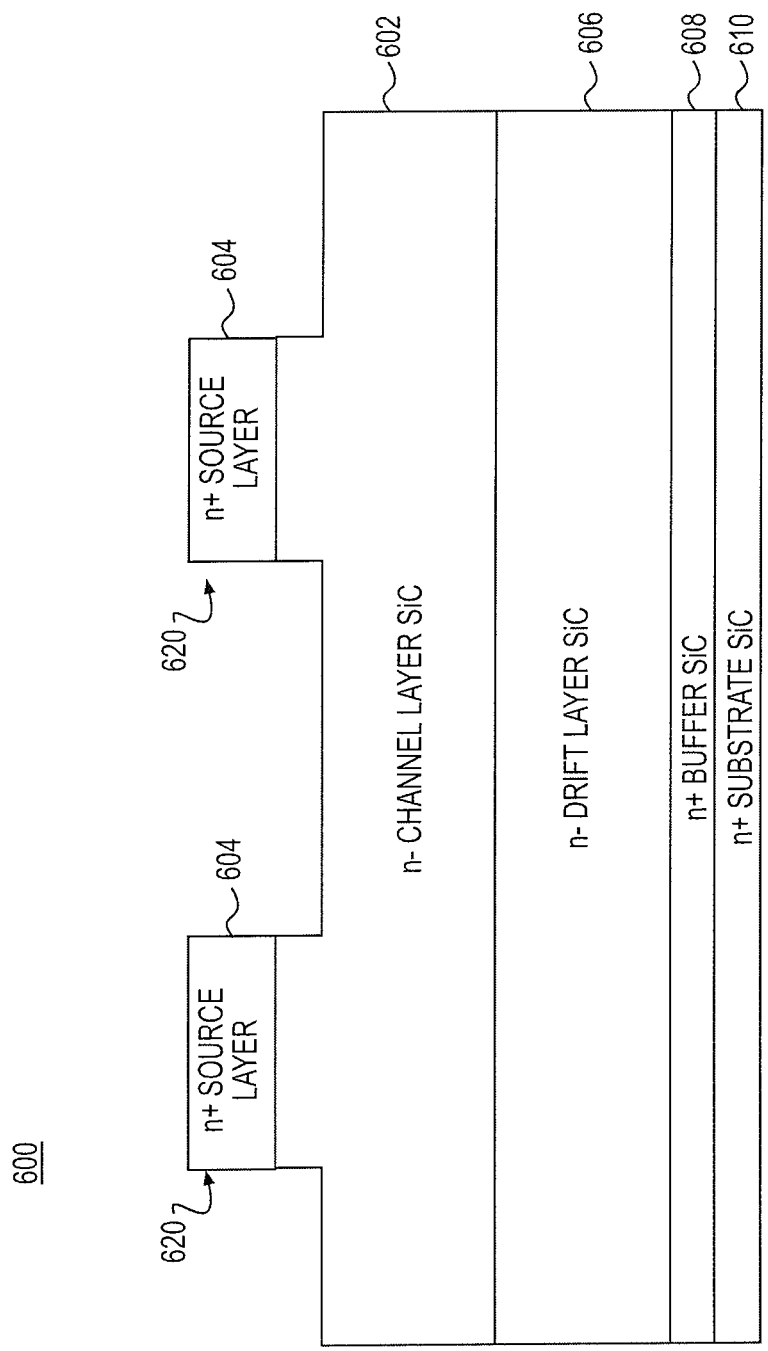
FIGS. 6B-6C are schematics of an embodiment of a semiconductor device, fabricated from a semiconductor stack as shown in FIG. 6A, with wider source mesas/pillars and increased gate spacing that minimize current flow differences.

With reference again to FIG. 5, method 500 forms a plurality of mesa structures (mesas) in the semiconductor stack, block 504. Mesas are areas that typically extend or rise above the remainder of the semiconductor stack. Mesas, or pillars as mesas may be referred to, may form the structure of semiconductor components such as the source (e.g., see n+ source mesa/pillar 402 of VJFET 400 shown in FIG. 4). Mesas may be formed, e.g., in first and second layers by chemically etching away (or otherwise removing) second layer and upper portions of the first layer except for where mesas are to remain. The mesas may be formed 504 by, e.g., reactive ion etching technique, or inductive coupled plasma technique. FIG. 6B illustrates semiconductor stack 600 with a plurality of mesas 620 formed by removing the second layer 604 and an upper portion of the first layer 602 except where mesas 620 remain. The distance between the mesas, i.e., the mesa pitch, may be from 0.5 microns to 40 microns. Although two to three mesas are shown in FIGS. 6B-6F for illustrative purposes, the semiconductor device with minimized current flow differences of the present invention may comprise from two to tens of thousands of mesas.

Figure 6C:
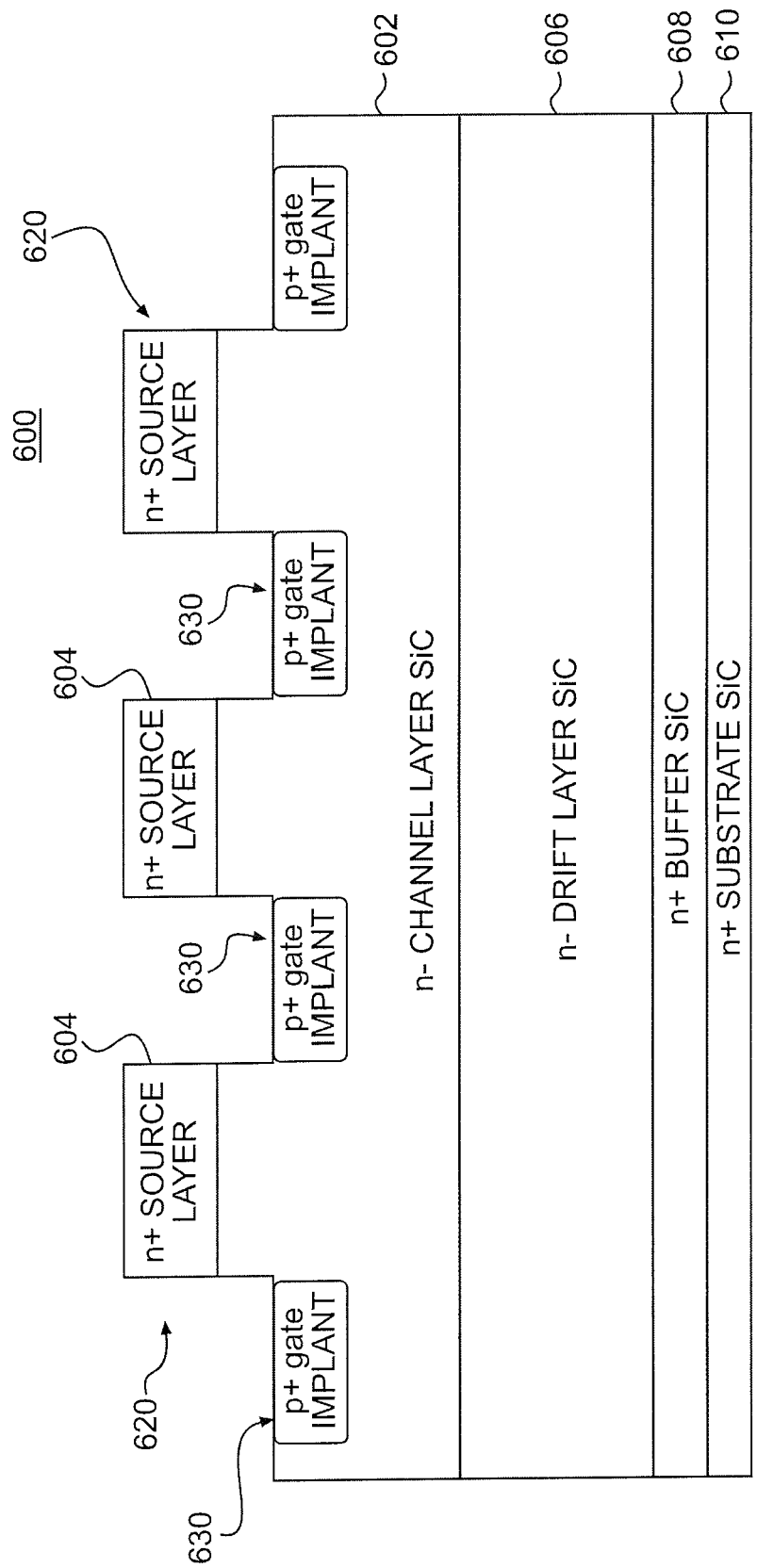

Method 500 forms a plurality of gates in the semiconductor layer stack, block 506. The gates have a second conductivity type (e.g, a p+ implant) and are formed 506 so that each gate is situated partially at a periphery of the mesas. Foiming 506 gates may include masking mesas and implanting, e.g., p+ doping using known techniques. Masking the mesas may include creating, e.g., a dielectric mask, a lithographic resist mask, and/or a metal mask. The mask may extend beyond the edges of the mesas, forming mask sidewalls, to protect the sides of the mesas. The mask dielectric may be a combination of, e.g., thermal oxide, deposited oxide, TEOS, silicon nitride, silicon dioxide, and/or SiO. Second conductivity type dopant species that may be used to implant the gates include, e.g., boron, aluminum, nitrogen, phosphorous. Gates may also be formed 506 by adding contacts, such as Ni Silicide contacts shown in FIG. 4 (e.g., as part of same step of or separately from forming contacts on mesas (on source pillars)). FIG. 6C illustrates semiconductor stack 600 with plurality of gates 630 formed so that gate 630 is situated partially at a periphery of the mesas 620 and is of a second conductivity type. Gate depth and width typically range between 0.2 microns and 5 microns. Method 500 foams 506 the plurality of gates to minimize current flow differences between a current flowing from the first layer to the plurality of mesas at a first applied gate bias and a current flowing from the first layer to the plurality of mesas at a second applied gate bias when voltage is applied to the semiconductor device formed by method 500. Various techniques, as described below, may be utilized by method 500 to form 506 the plurality of gates to minimize current flow differences between currents flowing from a first layer in stack to mesa at first and second applied gate bias.

Figure 2:
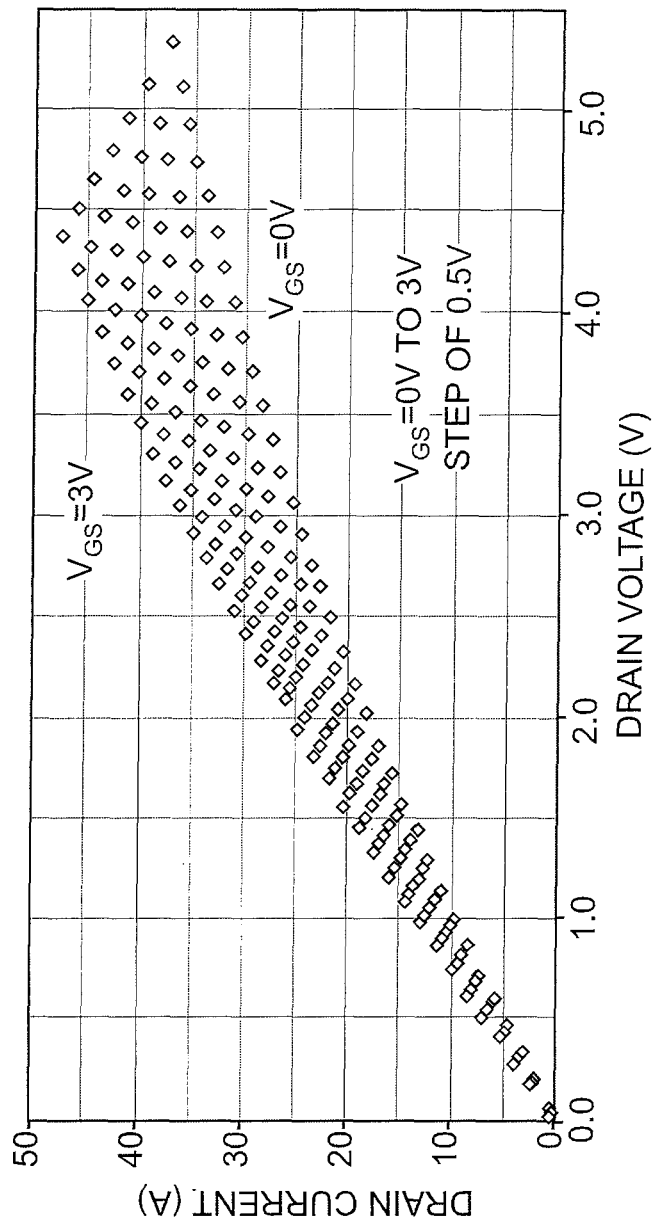
FIG. 2 is a graph illustrating VJFET drain current for increasing drain voltage at various gate-to-source voltage biases.
Figure 3:
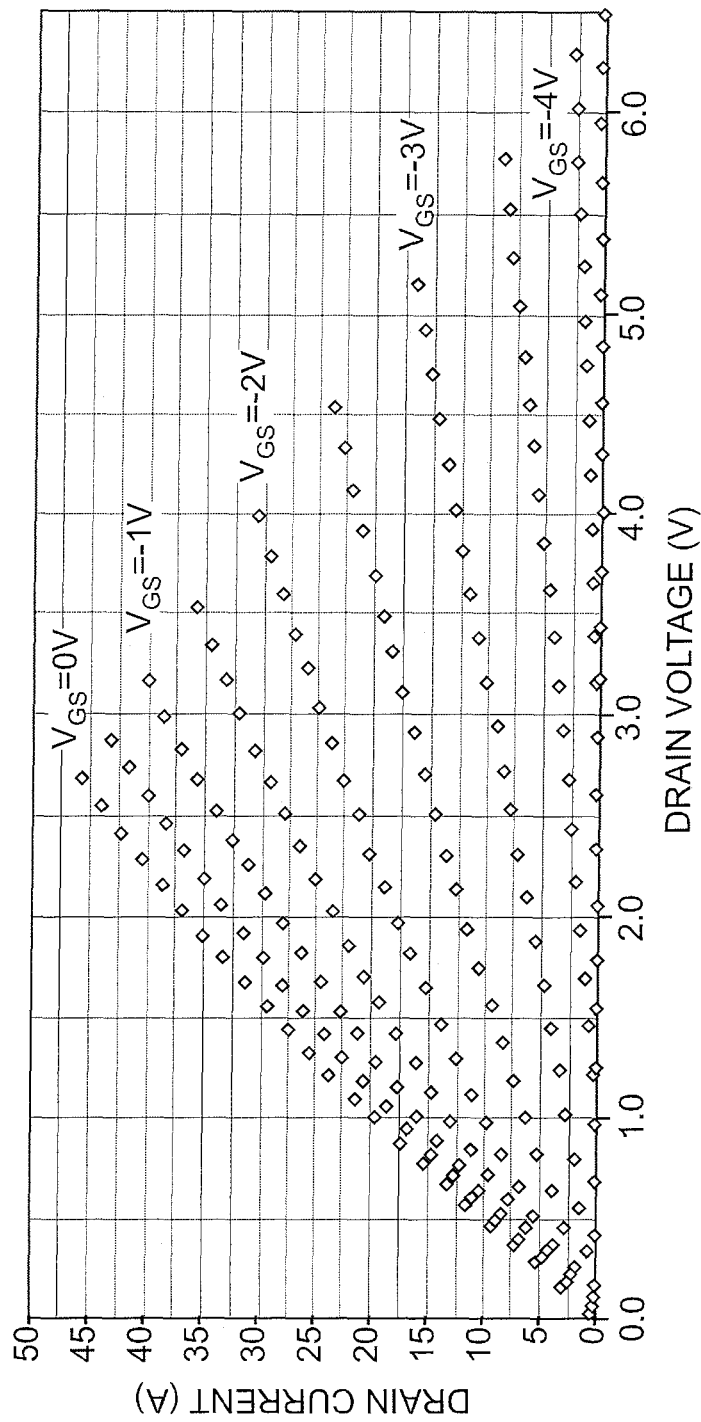
FIG. 3 is a graph illustrating VJFET drain current for increasing drain voltage at various gate-to-source voltage biases.
Figure 7:
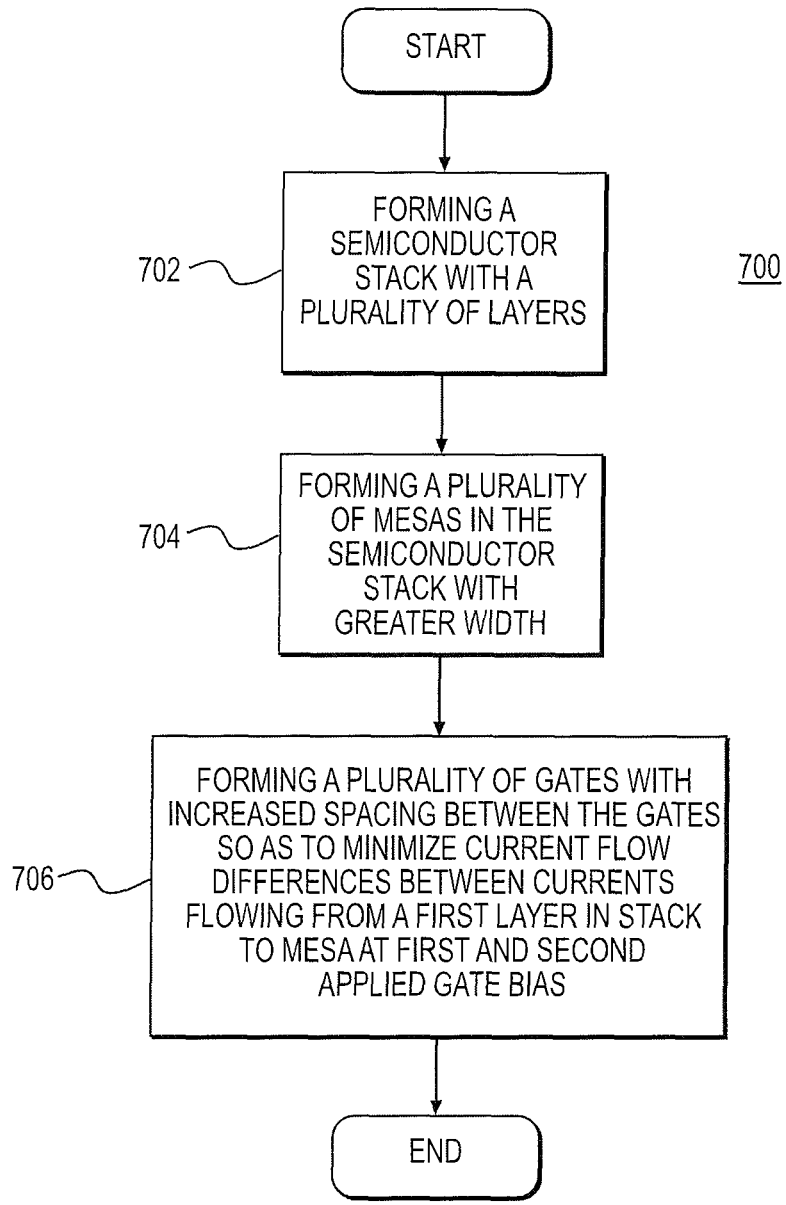
FIG. 7 is a flowchart illustrating an embodiment of a method for fabricating a semiconductor device with minimized current flow differences.
Figure 8:
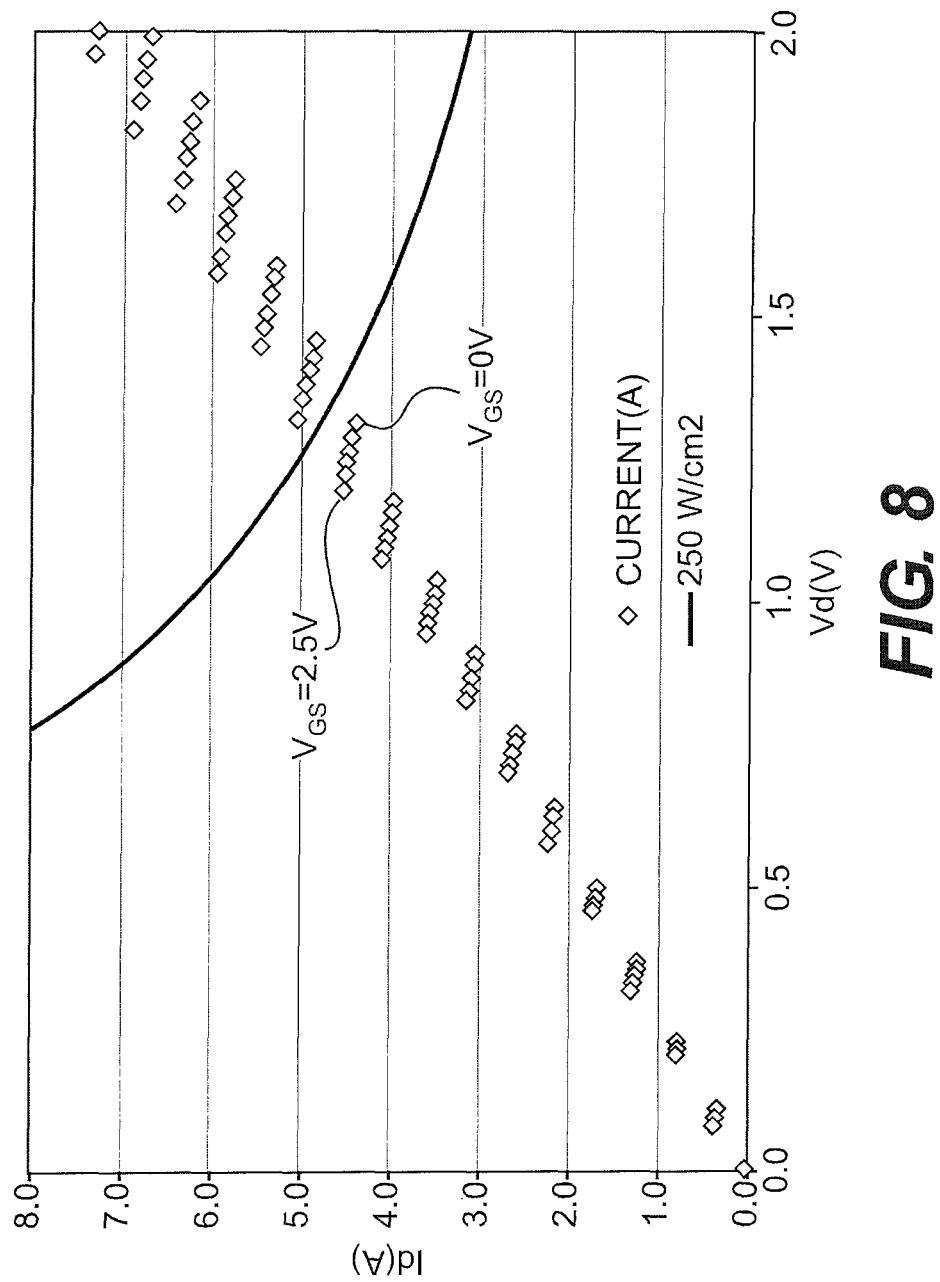
FIG. 8 is a graph illustrating VJFET drain current for increasing drain voltage at various gate-to-source voltage biases for an embodiment of a semiconductor device with wider source mesas/pillars and increased gate spacing that minimize drain current flow differences.

Indeed, method 500 may vary the forming 504 of the plurality of mesas so as to form 506 the plurality of gates to minimize current flow differences. For example, with reference now to FIG. 7, shown is an embodiment of method 700 of fabricating semiconductor devices with minimized current flow differences in which plurality of mesas are formed 704 with a greater width, thereby forming 706 the plurality of gates with increased spacing. Method 700 forms a semiconductor stack with a plurality of layers in the semiconductor stack, block 702. The semiconductor stack may be formed 702 as described above. Method 700 forms a plurality of mesas in the semiconductor stack with greater width, block 704. The width of these mesas/pillars (e.g., n+ source mesas/pillars 620) is greater than in standard semiconductor devices. In embodiments, the width of such mesas/pillars may be between 0.3 microns (μm) and 5 microns. By forming 704 the mesas with greater width, method 700 necessarily forms the plurality of gates (e.g., p+ gates 630) with increased spacing (refer to FIG. 6C, with wider mesas 620, the gates 630 formed on either side of mesas 620 will necessarily be formed further apart), block 706. The spacing of these gates is greater than in standard semiconductor devices. In embodiments, the spacing of such gates may be between 0.2 and 5 microns. FIG. 6C illustrates a semiconductor device with such spacing. FIG. 8 illustrates the drain current reduction as the unipolar gate bias drops from $V_{GS}=2.5$ V to $V_{GS}=0$V for a SiC VJFET with a wide source-pillar width (pillar width and gate-to-gate spacing for the SiC VJFET in FIG. 8 were 1.9 microns and 1.85 microns, respectively), fabricated according to method 700. The typical operating solid line of 250 W/cm$^2$ is also shown. As shown, the drain current is only reduced by approximately 6% over this gate bias drop. Compare this to a standard semiconductor device (e.g., standard width source pillars) drain current reduction of approximately 25%, as shown in FIG. 2 (pillar width and gate-to-gate spacing for SiC VJFET in FIG. 2 were 1.4 microns and 1.35 microns, respectively).

Therefore, increasing the source-pillar width and, as a result, the gate-to-gate spacing, as in method 700, results in lower resistance and less drain-current drop with decreased gate bias. Consequently, forming 704 and 706 minimizes current flow differences between a current flowing from the first layer to the plurality of mesas at a first applied gate bias and a current flowing from the first layer to the plurality of mesas at a second applied gate bias when voltage is applied to the semiconductor device formed by method 700. However, increased gate-to-gate spacing may also result in lower negative gate-to source voltage required to block drain voltage in the semiconductor device with wider source pillars. Accordingly, in semiconductor devices with increased gate-to-gate spacing for minimized current flow differences, design of a higher gate-to-source breakdown voltage may be required.

Figure 6D:
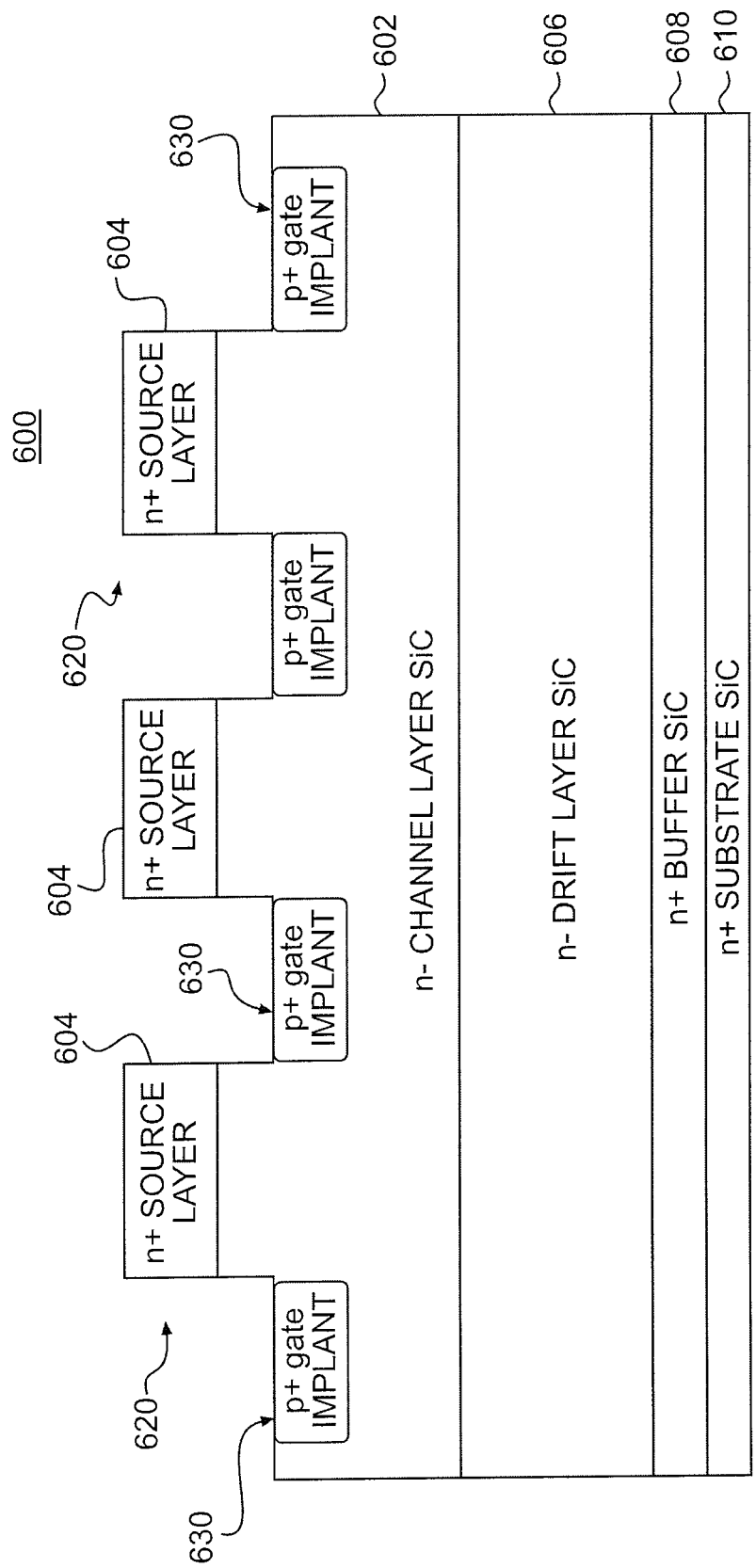
FIG. 6D is a schematic of an embodiment of a semiconductor device, fabricated from a semiconductor stack as shown in FIG. 6A, with narrower and shallower gate implant regions, resulting in increased gate spacing that minimizes current flow differences.
Figure 9:
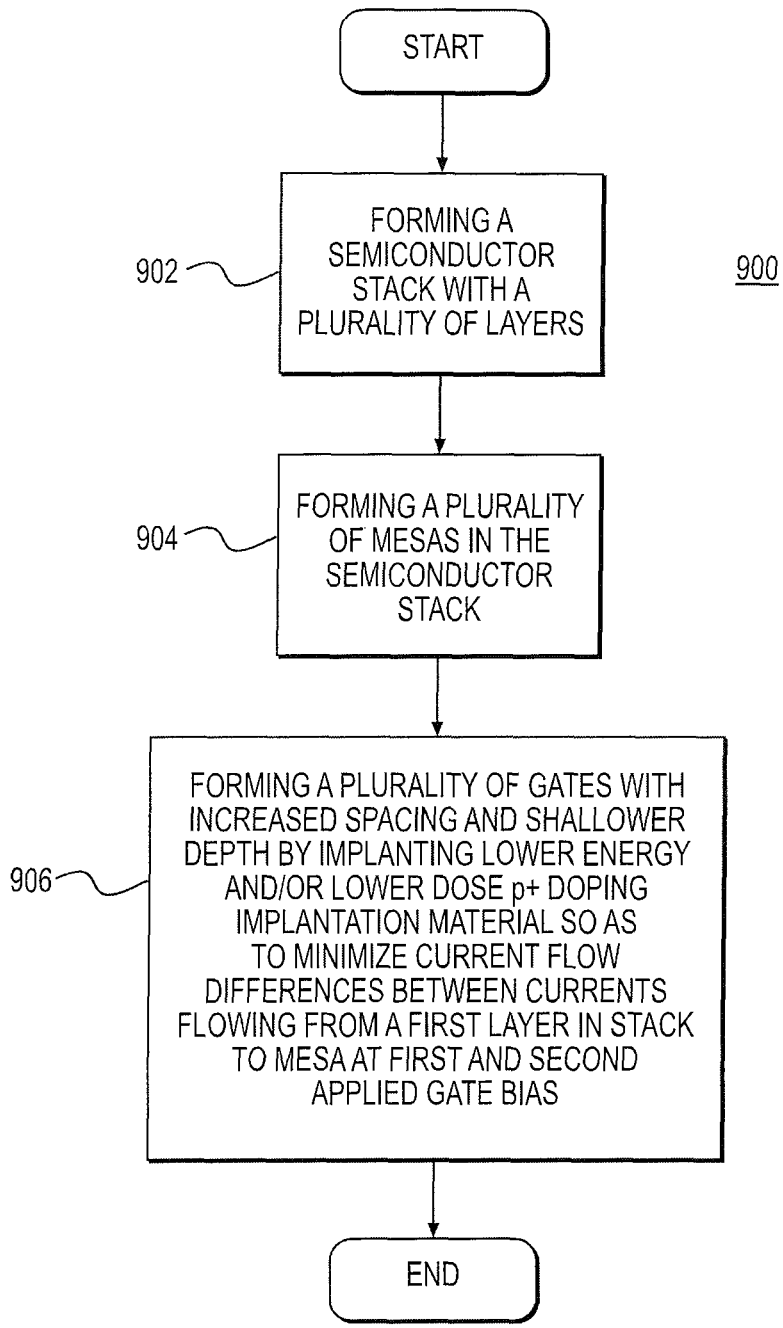
FIGS. 9-11 are flowcharts illustrating embodiments of a method for fabricating a semiconductor device with minimized current flow differences.

With reference now to FIG. 9, shown is an embodiment of method 900 of fabricating semiconductor devices with minimized current flow differences in which the gate implantation parameters are adjusted to increase gate-to-gate spacing. Implantation parameters (e.g., parameters of p+ doping implantation for gates) may include dose, energy, and temperature. Due to the negligible diffusion coefficients of common doping species in SiC and required temperatures in excess of 1800° C., conventional semiconductor diffusion processes are not applicable to SiC. Ion-implantation is the most practical doping process and selective doping of material may be achieved by employing masking techniques. Masking of the VJFET's source pillars (e.g., n+ source mesas/pillars 620) and other areas may be achieved by depositing metals of high mass or using combinations of thermally grown and deposited oxides. By utilizing an implantation recipe with a lower energy and dose, the implanted p+ gate depletion regions will extend less (less lateral straggle and vertical depth), which will result in wider gate-to-gate spacing, which is illustrated in FIG. 6D, which shows a semiconductor device 600 formed with lower energy and dose implantation material. Accordingly, method 900 forms a semiconductor stack with a plurality of layers in the semiconductor stack (e.g., as above), block 902, forms a plurality of mesas in the semiconductor stack (e.g., as above), block 904, and forms a plurality of gates with increased spacing and shallower depth by implanting lower energy and lower dose p+ doping implantation material, block 906.

Forming 906 gates with lower energy and lower dose p+ doping implantation material minimizes current flow differences between a current flowing from the first layer to the plurality of mesas at a first applied gate bias and a current flowing from the first layer to the plurality of mesas at a second applied gate bias when voltage is applied to the semiconductor device formed by method 900. Gates formed 906 with the lower energy and lower dose p+ doping implantation are shown in FIG. 6D, as noted above. The energy of implantation material and/or the dose of the implantation material may be less than in a standard semiconductor device (e.g., standard SiC VJFET device). In an embodiment, the implantation material may be chosen from, e.g, boron, aluminum, nitrogen, and phosphorous, the energy may be as low as 5 keV, and the dose used may be as low as $10^{14}$ ions/cm$^3$. The implantation temperature may range from room temperature to 1500° C. A disadvantage of the narrower and shallower implantation region of gates formed 906 per above is that lower negative gate-to-source voltage may be required to block drain voltage, as above. The lower dose/energy implantation (shallow implant) produces wider gate-to-gate spacings, which result in lower negative gate-to-source voltage required to block drain voltage, lower resistance, and less drain-current drop with decreased gate bias. Accordingly, in semiconductor devices with lower dose/energy implantation for minimized current flow differences, design of a higher gate-to-source breakdown voltage may be required.

Figure 12:
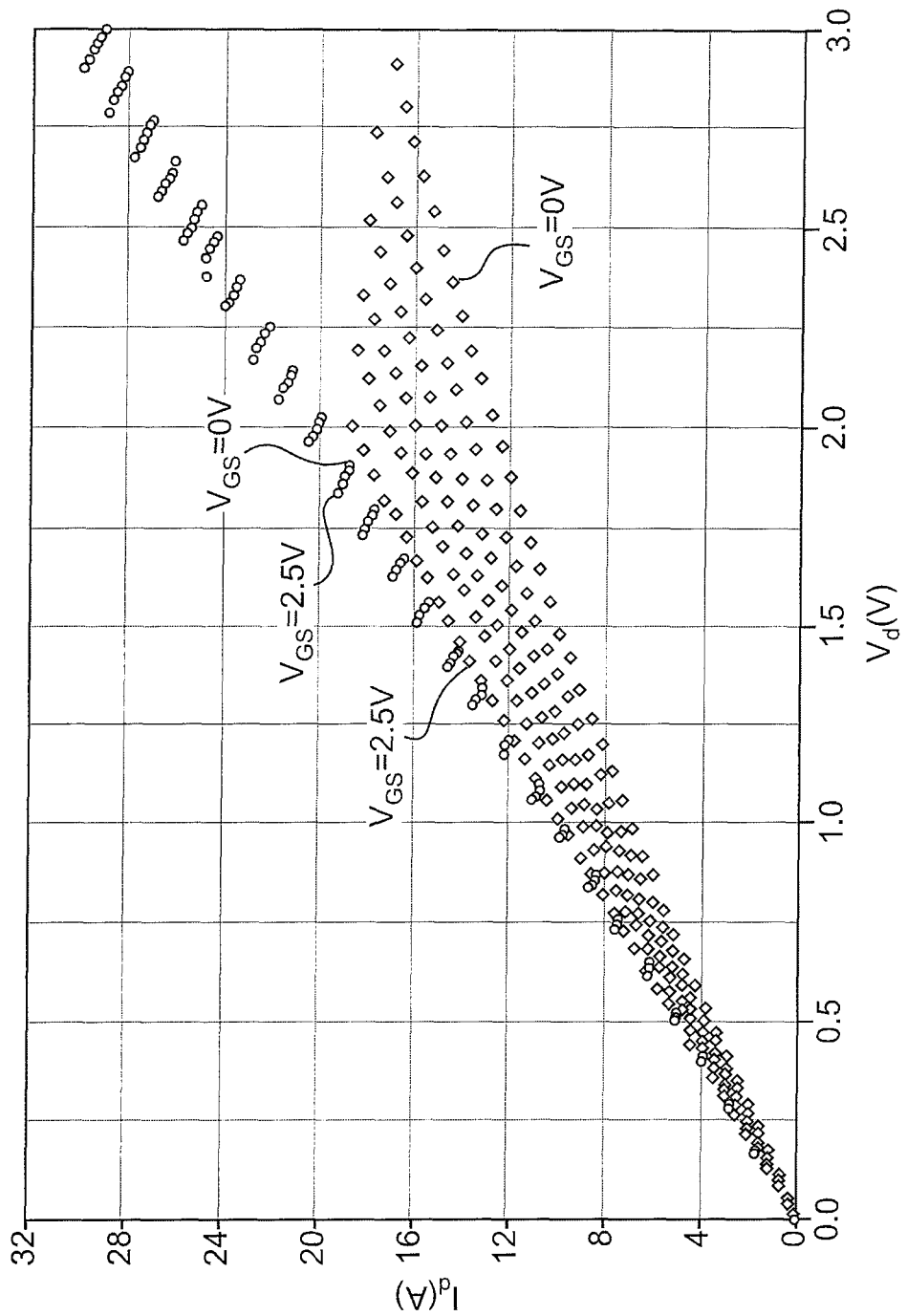
FIG. 12 is a graph comparing VJFET drain current versus drain voltage at various gate-to-source voltage biases for an embodiment of a semiconductor device with lower dose/energy implantation and a semiconductor device with standard dose/energy implantation.

FIG. 12 illustrates the drain current reduction as the unipolar gate bias drops from $V_{GS}=2.5$ V to $V_{GS}=0$ V for a SiC VJFET with a lower dose/energy implantation (open circles) fabricated according to method 900, and a SiC VJFET with a standard implantation (filled squares). The pillar widths and gate-to-gate spacings for the lower dose/energy implantation SiC VJFET in FIG. 12 are 1.6 microns and 1.55 microns. The implant doses are $6\times10^{15}$ and $9.9\times10^{15}$ ions/cm$^3$ for the lower dose and standard dose implantations, respectively. As shown, the drain current is only reduced by approximately 3% over the $V_{GS}=2.5$ V to $V_{GS}=0$V unipolar gate bias drop for the lower dose/energy implantation VJFET fabricated according to method 900. Compare this to the standard implantation semiconductor device drain current reduction of approximately 17% over the unipolar gate bias drop of $V_{GS}=2.5$ V to $V_{GS}=0$V, as shown by the filled squares in FIG. 12.

Figure 10:
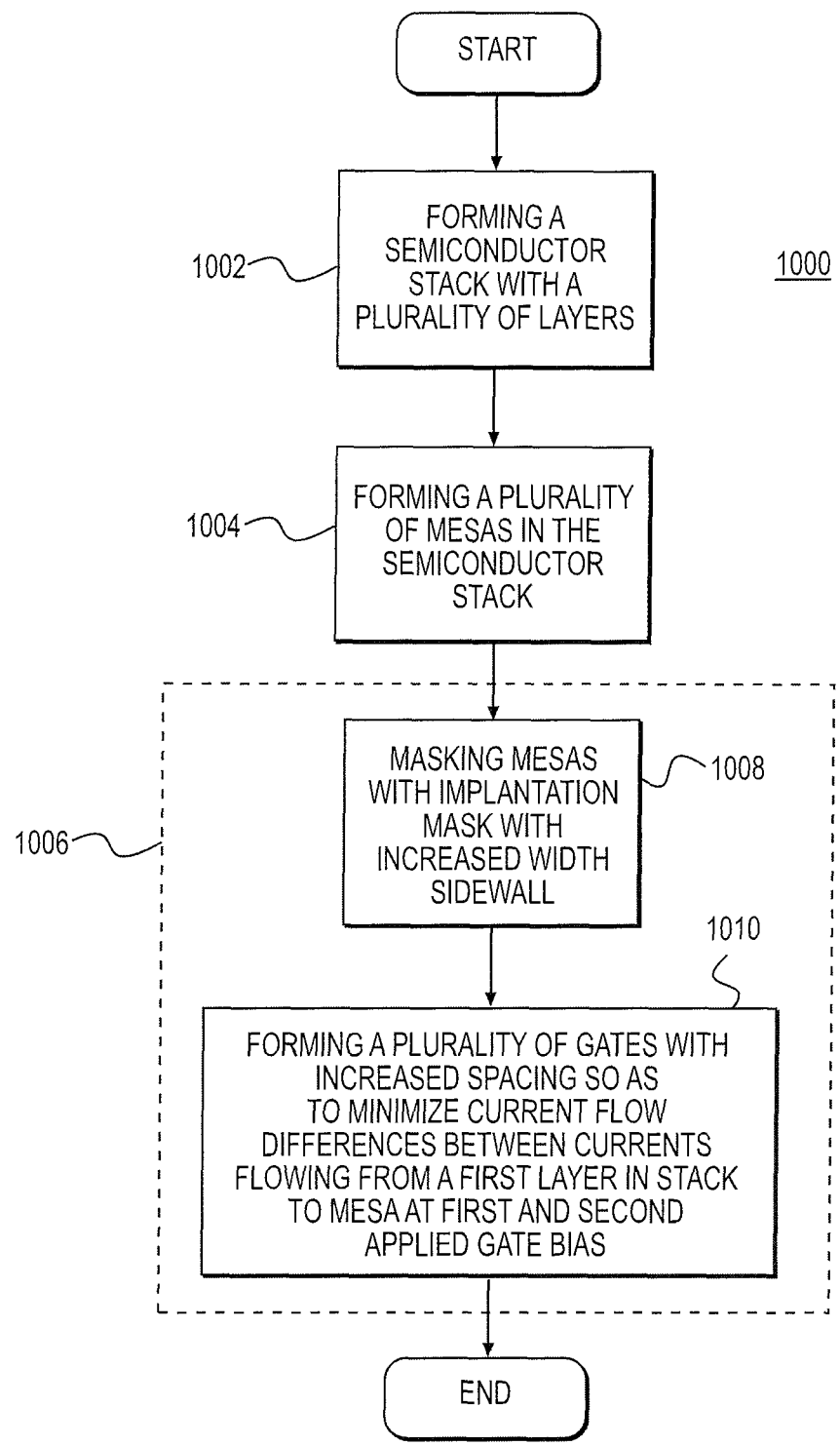

With reference now to FIG. 10, shown is another embodiment of method 1000 of fabricating semiconductor devices with minimized current flow differences in which thickness of mesa sidewall dielectric is increased prior to implantation to increase gate-to-gate spacing. When, e.g., p+ doping is implanted to form p+ gates, mesas (e.g., n+ source mesas/pillars 620) are masked to prevent implantation of p+ doping onto mesas. The mask may be a dielectric. If the thickness of the mesa sidewalls is increased on the mask, the region in which p+ doping is implanted will be decreased, reducing width of p+ gates and increasing gate-to-gate spacing. Method 1000 forms a semiconductor stack with a plurality of layers in the semiconductor stack (e.g., as above), block 1002, forms a plurality of mesas in the semiconductor stack (e.g., as above), block 1004, and forms a plurality of gates with increased spacing, block 1006. Forming 1006 a plurality of gates is shown as including masking mesas with implantation mask with increased width sidewalls extending beyond mesas, block 1008 and implanting doping material to form gates with increased spacing, block 1010. The sidewalls of the implantation mask (i.e., the portion of mask extending past edges of mesas) are greater than in standard semiconductor device fabrication. For example, the mesa sidewall mask dielectric may have a thickness of between 50 Å and 20-kÅ. As noted above, forming 1010 gates with increased spacing minimizes current flow differences between a current flowing from the first layer to the plurality of mesas at a first applied gate bias and a current flowing from the first layer to the plurality of mesas at a second applied gate bias when voltage is applied to the semiconductor device formed by method 1000.

Figure 6E:
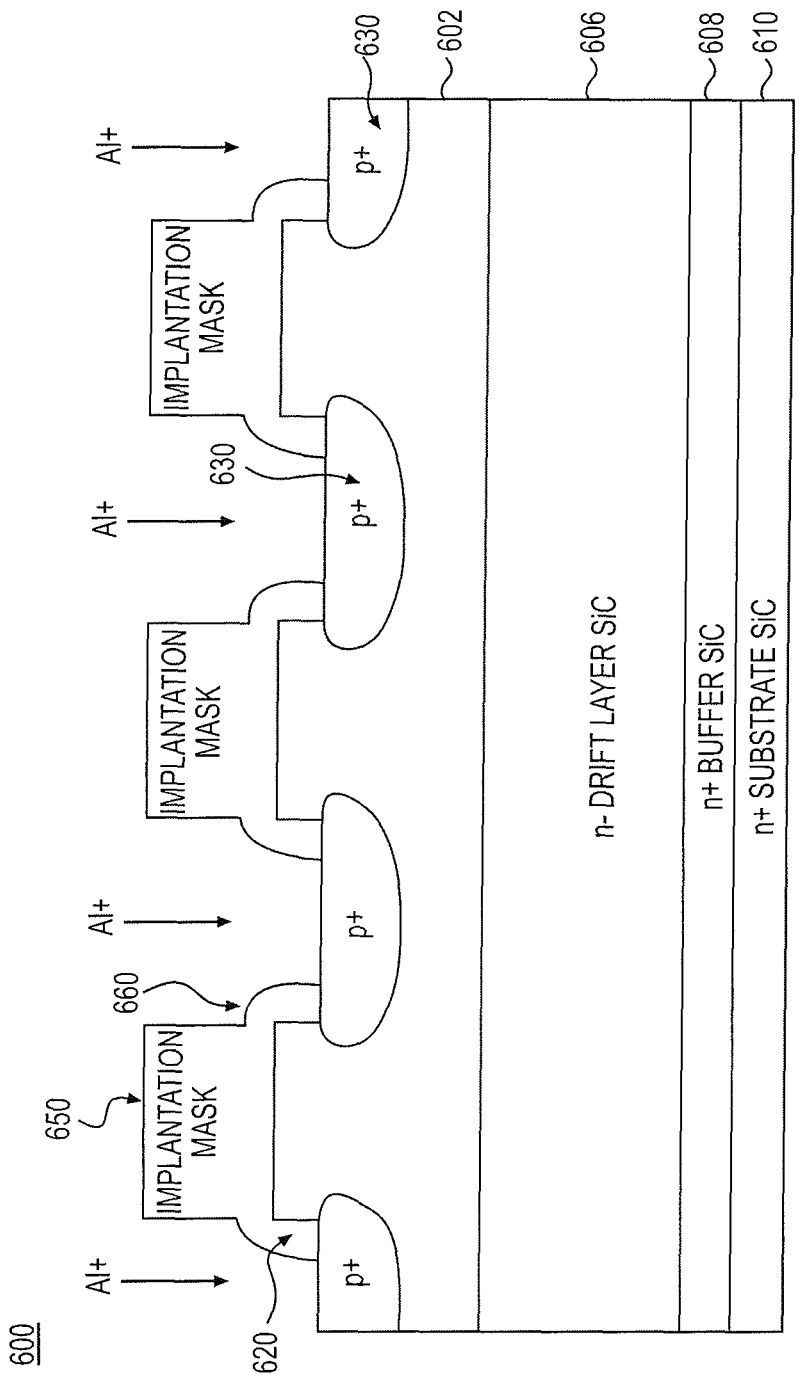
FIG. 6E is a schematic of an embodiment of a semiconductor device, fabricated from a semiconductor stack as shown in FIG. 6A, with wider source mesa/pillar sidewall dielectrics resulting in increased gate spacing that minimizes current flow differences.

With reference now to FIG. 6E, shown is semiconductor stack/device 600 (e.g., SiC VJFET) with implantation masks 650 with sidewalls 660 that extend beyond mesas 620. The sidewalls 660 of masks 650 are wider than in standard semiconductor fabrication process. The larger the mask sidewall 660 extent from the horizontal edges of the SiC source-pillar 620, the smaller the SiC area in first layer 602 that gets p+ implanted, and the larger the spacing between the resultant p+ gate regions 630. As an example, for a 2-kÅ wide oxide mask, the p+ implanted gate regions are in relatively close proximity leading to a less wide gate-to-gate spacing. As the oxide mask sidewall 660 width increases to 4-kÅ and 5-kÅ, the wider p+ gate-to-gate spacings result in lower negative gate-to source voltage required to block drain voltage, lower resistance, and less drain-current drop with decreased gate bias.

Gate-to-gate spacings may also be increased by selection of the p-type doping species. For example, Aluminum is, like Boron, commonly used as an acceptor dopant in SiC. High concentrations of Aluminum must be introduced for highly conductive p-type material. Aluminum is known to have a lower lateral straggle than Boron. Consequently, aluminum implanted p+ gates have wider gate-to-gate spacing, resulting in lower voltage-blocking, lower resistance, and less drain-current drop with decreased gate bias.

It is further noted that any combination of the above techniques may be used to widen the gate-to-gate spacing in SiC VJFETs for bidirectional power flow applications. Semiconductor devices fabricated using the above techniques, may exhibit a current flow at 0 V gate bias that is higher than 80% of the current flow at the maximum unipolar gate bias. By designing a wide gate-to-gate spacing, SiC VJFETs can be operated below their maximum unipolar gate bias of about $V_{GS}=2.7$ V to satisfy Eq. (1) above without a significant compromise in drain-current output.

Increasing gate-to-gate spacing results in VJFETs that require a high gate-to-source reverse voltage in order to block a specified drain voltage. A wide source-pillar VJFET whose on-state drain-current characteristics appear in FIG. 8, requires a gate-to-source voltage of 45 V in order to block a drain voltage of 1100-V. In contrast, a narrower source-pillar VJFET whose on-state drain-current characteristics appear in FIG. 2, requires a gate-to-source voltage of 22 V in order to block the same drain voltage of 1100 V.

A concern with the design of large gate-to-gate spacing VJFETs (i.e., for efficient bidirectional power flow applications) is that the gate-to-source breakdown-voltage might not be adequate for blocking the maximum drain voltage for which the VJFET is designed. In addition, a sufficiently large gate-to-source breakdown-voltage is necessary to protect the VJFET against gate-voltage overshoots during switching.

Figure 11:
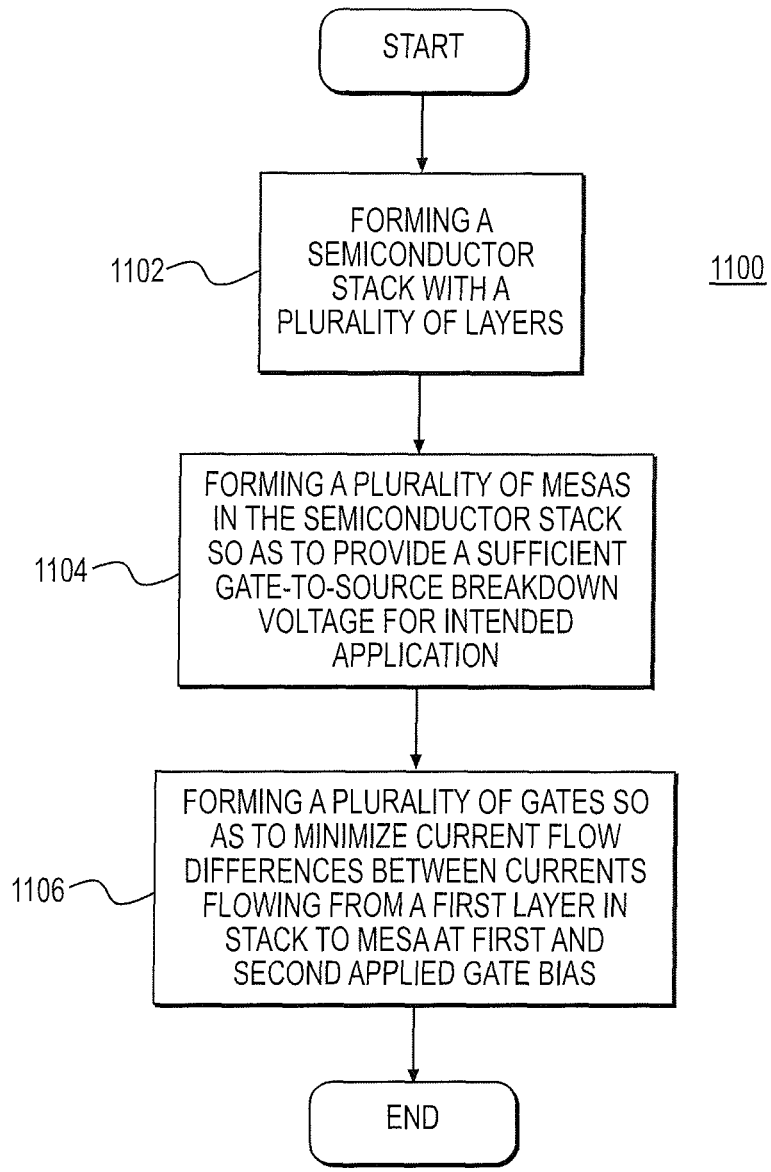

To overcome the limitation of more negative gate-to source voltage required to block drain voltage, potentially exhibited by large p+ gate-to-gate spacing VJFETs described herein, embodiments provide a high gate-to-source breakdown voltage independently of p+ gate-to-gate spacing. With reference now to FIG. 11, shown is an embodiment of method 1100 of fabricating semiconductor devices with minimized current flow differences and high gate-to-source breakdown voltage. Embodiments of method 1100 accomplish this by adjusting the vertical separation between the n+ source and p+ gate regions of the semiconductor device (e.g., SiC VJFET). By fabricating (e.g., etching) a deeper n+ source pillar, the p+ gates are further separated from the n+ sources, which increases gate-to-source breakdown voltage without affecting the characteristics of the gate-to-gate spacing. Method 1100 offers a degree of design freedom in that a large p+ gate-to-gate spacing can be designed independently and without concern for gate-to-source breakdown value adequacy.

Figure 6F:
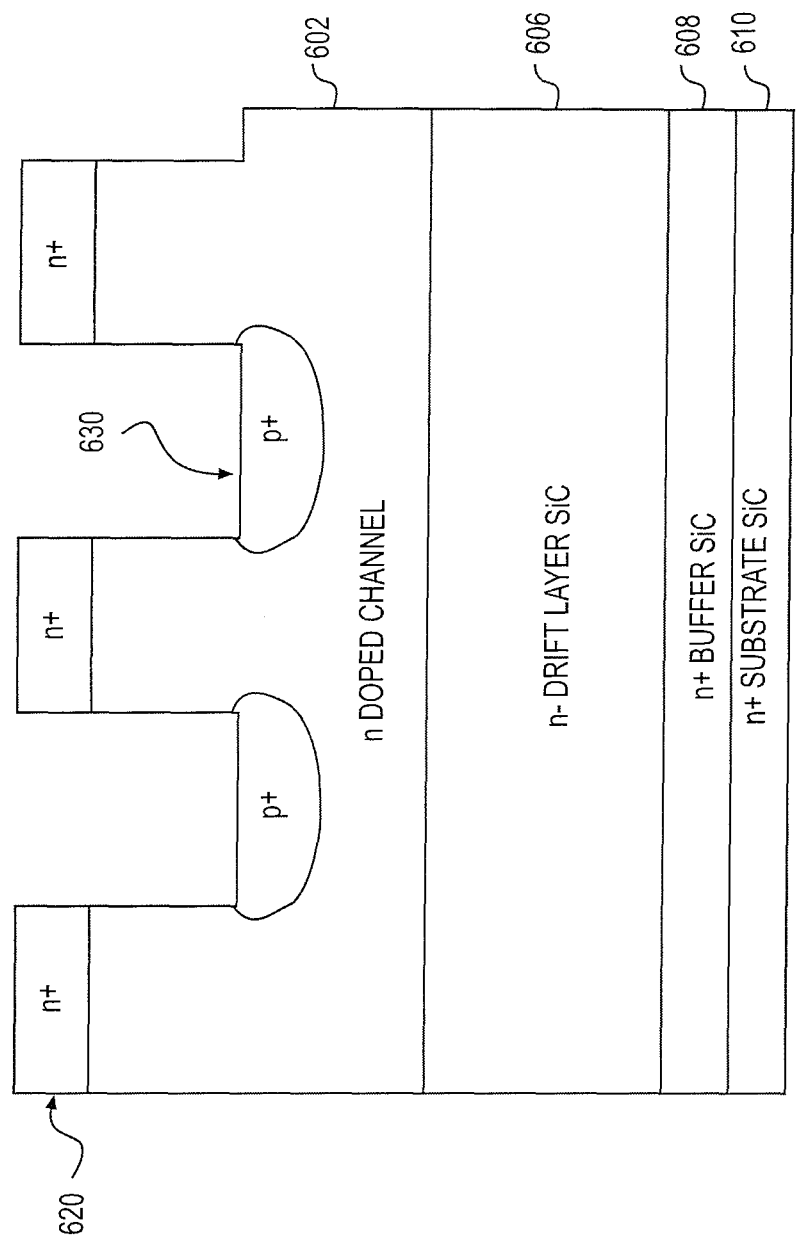
FIG. 6F is a schematic of an embodiment of a semiconductor device, fabricated from a semiconductor stack as shown in FIG. 6A, with increased mesa height, resulting in higher gate-to-source breakdown voltage and greater drain voltage blocking capability.

Method 1100 forms a semiconductor stack with a plurality of layers in the semiconductor stack (e.g., as above), block 1102 and forms a plurality of gates with increased spacing so as to minimize current flow differences between currents flowing from a first layer in stack to mesa at first and second applied gate bias, block 1106. Method 1100, however, forms a plurality of mesas in semiconductor stack so as to provide a sufficiently high gate-to-source breakdown voltage for the intended device application, block 1104, which may require blocking voltages of hundreds to tens of thousands of volts. Plurality of mesas may be formed 1104 to provide sufficiently high gate-to-source breakdown voltage by etching mesas deeper into first layer of semiconductor stack (e.g., first layer 602). FIG. 6F illustrates semiconductor device with mesas formed 1104 with deeper etching (e.g., compare to FIG. 6E mesas depths). The mesa/pillar height (i.e., vertical separation between top of mesas and top of plurality of gates) formed 1104 should range between 0.1 microns and 10 microns, depending on desired gate-to-source breakdown voltage. The mesa/pillar height typically depends on the application. In an example, 0.5 microns is the standard depth/height and 1 micron is the increased depth/height. Experiments have shown an average increase in gate-to-source breakdown voltage of approximately 260% for an average increase in source pillar depth of 50%.

As is illustrated by FIG. 4, the semiconductor devices formed by the methods, such as methods 500, 700, 900, and 1000, described herein may include additional features, such as source interconnect, gate metal interconnect, silicide ohmic contacts, a drain, etc. Consequently, the methods described herein may include additional steps (not shown) to fabricate these features. Processes of fabricating these features are well-known to those of ordinary skill in the art.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

The invention claimed is:

1. A method for fabricating a semiconductor device with minimized current flow differences comprising:
   forming a semiconductor stack including a plurality of layers that include a first layer having a first conductivity type and a second layer having a first conductivity type, wherein the second layer is on top of the first layer;
   forming a plurality of mesas in the semiconductor layer stack; and
   forming a plurality of gates in the semiconductor layer stack having a second conductivity type and situated partially at a periphery of the mesas, wherein the plurality of gates is formed to minimize current flow differences between a current flowing from the first layer to the plurality of mesas at a first applied gate bias and a current flowing from the first layer to the plurality of mesas at a second applied gate bias when voltage is applied to the semiconductor device by increasing the spacing between each of the gates and wherein the forming a plurality of gates includes:
      masking the plurality of mesas with a plurality of masks that are each wider than each mesa, wherein the masks cover and protect the plurality of mesas from dopant implantation and increase the spacing of the gates between each other by masking an area greater in width than the plurality of mesas and narrowing the area available for implantation;
      implanting the semiconductor layer stack; and
      removing the masks.

2. The method of claim 1 wherein the forming a plurality of mesas comprises:
   etching the plurality of mesas.

3. The method of claim 1 wherein the forming creates a vertical separation between a top of the plurality of mesas and a top of the plurality of gates by etching around the mesas.

4. The method of claim 3 wherein the first applied gate bias is 2.5 volts.

5. The method of claim 3 wherein the second applied gate bias is 0 volts.

6. The method of claim 3 wherein the semiconductor device is a vertical junction-field-effect-transistor (JFET).

7. The method of claim 1 wherein the implanting the semiconductor layer stack comprises p+-doped implanting the semiconductor layer stack.

8. The method of claim 3, wherein the first applied gate bias and the second applied gate bias are positive unipolar biases.

9. The method of claim 1 wherein the forming a semiconductor stack forms a semiconductor stack that includes a third layer having a first conductivity type.

10. The method of claim 9 wherein the first layer and third layer have different polarity.

11. A method for fabricating a semiconductor device with minimized current flow differences comprising:
    forming a semiconductor stack including a plurality of layers that include a first layer having a first conductivity type and a second layer having a first conductivity type, wherein the second layer is on top of the first layer;
    determining a normal gate depth and width of the semiconductor device being fabricated by the method, wherein the gate depth and width is a cross-sectional depth and width of the gates in the semiconductor device; and
    forming a plurality of mesas in the semiconductor layer stack; and
    forming a plurality of gates in the semiconductor layer stack having a second conductivity type and situated partially at a periphery of the mesas, wherein the forming a plurality of gates increases the spacing of the gates by adjusting implantation parameters of the gates so that gates are shallower and narrower than the normal gate depth and width, and the plurality of gates is formed to minimize current flow differences between a current flowing from the first layer to the plurality of mesas at a first applied gate bias and a current flowing from the first layer to the plurality of mesas at a second applied gate bias when voltage is applied to the semiconductor device by increasing the spacing between each of the gates.

12. The method of claim 11 wherein the forming creates a vertical separation between a top of the plurality of mesas and a top of the plurality of gates by etching around the mesas.

13. The method of claim 11 wherein the first applied gate bias is 2.5 volts.

14. The method of claim 11 wherein the second applied gate bias is 0 volts.

15. The method of claim 11 wherein the semiconductor device is a vertical junction-field-effect-transistor (JFET).

* * * * *

UNITED STATES PATENT AND TRADEMARK OFFICE
CERTIFICATE OF CORRECTION

| | | |
|---|---|---|
| PATENT NO. | : 8,664,048 B2 | Page 1 of 1 |
| APPLICATION NO. | : 12/980005 | |
| DATED | : March 4, 2014 | |
| INVENTOR(S) | : John V. Veliadis | |

It is certified that error appears in the above-identified patent and that said Letters Patent is hereby corrected as shown below:

Title Page Item (73) Assignee: delete "Grummen" and insert therefor --Grumman--.

Signed and Sealed this
Eighth Day of July, 2014

Michelle K. Lee
*Deputy Director of the United States Patent and Trademark Office*